United States Patent [19]
Kobayashi

[11] Patent Number: 6,091,598
[45] Date of Patent: Jul. 18, 2000

[54] LAMINATED CERAMIC ELECTRONIC PART INCLUDING A PLURALITY OF INTERNAL ELECTRODES HAVING TWO LEADING PORTIONS AND A NON-EXPOSED PORTION BETWEEN THE TWO LEADING PORTIONS

[75] Inventor: Ryo Kobayashi, Akita, Japan

[73] Assignee: TDK Corporation, Tokyo, Japan

[21] Appl. No.: 09/050,072

[22] Filed: Mar. 30, 1998

[30] Foreign Application Priority Data

Mar. 28, 1997 [JP] Japan ................................ 9-077738

[51] Int. Cl.[7] .............................. H01G 4/12; H01G 4/30; H01G 4/228
[52] U.S. Cl. .................... 361/303; 361/306.3; 361/313; 29/25.42
[58] Field of Search ................................ 361/301.4, 303, 361/306.3, 308.1, 307, 311–313, 321.2–321.5, 329; 29/25.42, 25.35; 156/64, 89, 235

[56] References Cited

U.S. PATENT DOCUMENTS

| 4,517,406 | 5/1985 | Erdle ...................................... 29/25.42 |
| 4,771,520 | 9/1988 | Tanaka et al. .......................... 174/728 |
| 5,417,874 | 5/1995 | Kobayashi et al. ...................... 156/64 |
| 5,440,794 | 8/1995 | Kaeriyama et al. .................... 29/25.42 |

FOREIGN PATENT DOCUMENTS

| 7-97537 | 10/1995 | Japan . |
| 2-504229 | 4/1996 | Japan . |
| 8-306579 | 11/1996 | Japan . |
| 8-321434 | 12/1996 | Japan . |

OTHER PUBLICATIONS

Patent Abstracts of Japan, vol. 17, No. 593 (E–1454), Oct. 28, 1993, JP 05–182858, Jul. 23, 1993.
Patent Abstracts of Japan, vol. 96, No. 1, Jan. 31, 1996, JP 07–235442, Sep. 5, 1995.
Patent Abstracts of Japan, vol. 96, No. 4, Apr. 30, 1996, JP 07–335479, Dec. 22, 1995.
Patent Asbtracts of Japan, vol. 97, No. 3, Mar. 31, 1997, JP 08–306579, Nov. 22, 1996.
Patent Abstracts of Japan, vol. 97, No. 4, Apr. 30, 1997, JP 08–321434, Dec. 3, 1996.

*Primary Examiner*—Kristine Kincaid
*Assistant Examiner*—Anthony Dinkins
*Attorney, Agent, or Firm*—Oblon, Spivak, McClelland, Maier & Neustadt, P.C.

[57] ABSTRACT

A partial blank of internal electrode is previously provided on the area of a green sheet on which an internal electrode is formed and at which it is to be cut adjacent to a main part of the internal electrode constituting the capacitance of a capacitor. The propriety of a cutting position is judged by examining if a non-exposed portion corresponding to the partial blank of the internal electrode exists on the edge face of the laminated product obtained by cutting the laminated board. In addition, two leading portions are formed at the leading side of the internal electrode, and the end of the two leading portions is exposed at the edge face of the laminated product. In this arrangement, a non-exposed portion of the internal electrode is formed between the two leading portions.

8 Claims, 7 Drawing Sheets

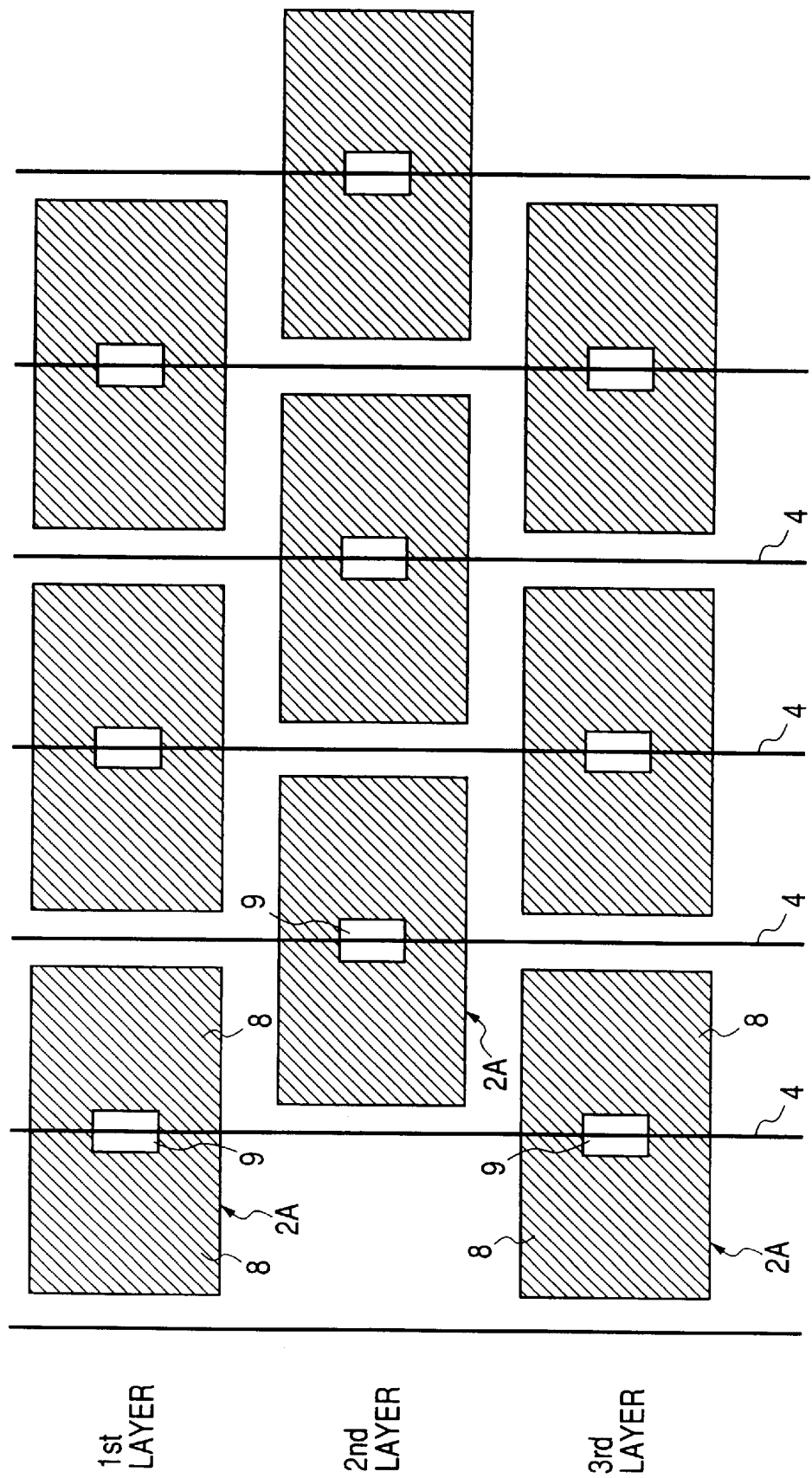

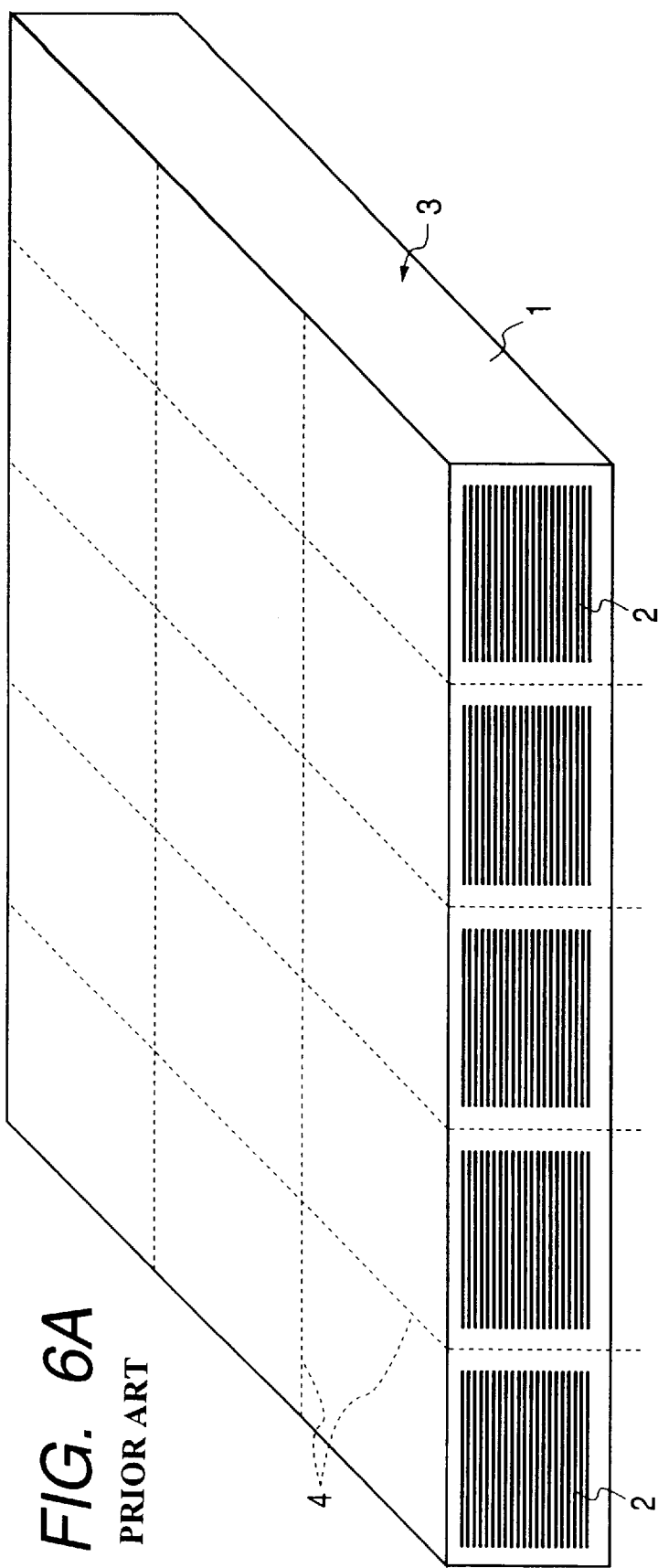
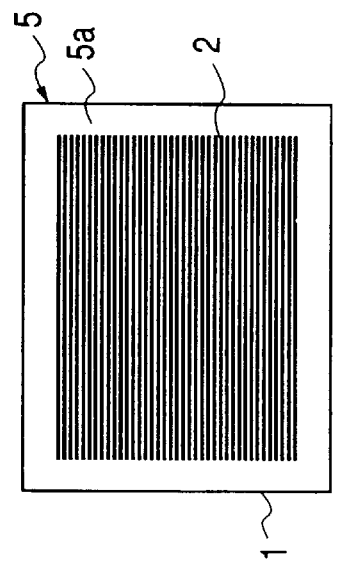
FIG. 6A PRIOR ART
FIG. 6B PRIOR ART

LAMINATED CERAMIC ELECTRONIC PART INCLUDING A PLURALITY OF INTERNAL ELECTRODES HAVING TWO LEADING PORTIONS AND A NON-EXPOSED PORTION BETWEEN THE TWO LEADING PORTIONS

BACKGROUND OF THE INVENTION

1. Field of the Invention

The present invention relates to a method for judging the propriety of a cutting position on a laminated board in laminated ceramic electronic parts such as a laminated ceramic capacitor and a laminated ceramic electronic part having a structure suitable for the application of the method.

2. Description of the Related Art

With the miniaturization of electronic apparatus, miniaturization has been keenly required of electronic parts to be mounted thereon. Thus, further miniaturization for the same capacitance has been required of capacitors. The smaller the size of electronic parts, such as a laminated ceramic capacitor is, the more is the number of such electronic parts obtained per laminated board by laminating ceramic green sheets, partly because these products are small-sized. Accordingly, a big problem to be solved in the art is the enhancement of yield.

In some detail, it is important in a process which comprises cutting a laminated board 3 consisting of a ceramic 1 and an internal electrode 2 along a cutting line 4 as shown in FIG. 6A to prepare a laminated product (chip) 5 as shown in FIG. 6B that cutting be effected while maintaining a high yield. Under these circumstances, JP-B-7-97537 (The term "JP-B" as used herein means an "examined Japanese patent publication") and JP-A-8-306579 (The term "JP-A" as used herein means an "unexamined Japanese patent publication (kokai)") propose that the cutting line be determined by reading the difference in level developed by the presence or absence of internal electrode 2. Japanese Patent No. 2,504,229 proposes that a mark for positioning in cutting be put on the uppermost layer in the laminated board 3.

However, the foregoing approach involving marking the laminated board 3 or cutting along the unevenness on the surface of the laminated board 3 is disadvantageous in that it is very difficult to see if cutting is effected in a desired position for every product. Accordingly, in practice, this confirmation must be accomplished by screening defectives out of the products at a measuring step after the completion of the products. However, even if the cutting line shifts from the desired position 4 to a position 4a and the distance L between the edge face 5a of the laminated product 5 on which the end of one of the two parts of the internal electrode 2 and the end a of an internal electrode 2X vertically opposed to the internal electrode 2X is thus slight, which case should be judged defective, the product can be judged good, making it likely that the deterioration of the properties of the product can be accelerated with time after mounted on electronic apparatus. Terminal electrodes (not shown) to be connected to the end of the internal electrodes 2, 2X are then provided on the edge face 5a of the laminated product 5 thus cut by baking or plating.

However, the conventional production process is disadvantageous in that since the internal electrode 2 is cut at the same width as for the internal electrode 2X vertically adjacent thereto, the cutting position cannot be judged inappropriate even if the distance L between the end a of the internal electrode 2X vertically adjacent to the internal electrode 2 and the cutting line 4 (edge face 5a) is extremely small as shown in FIG. 7. Further, if the laminated product 5 is cut at the position shown by the reference numeral 4b in FIG. 7 by mistake, the number of internal electrodes exposed at the edge face 5a of the laminated product is doubled. It is difficult for capacitors comprising a ceramic layer having a thickness of few micrometers between the internal electrodes 2 and 2X to judge the propriety of cutting position not only visually but also under microscope by seeing if the number of internal electrodes exposed is great or small.

Further, the approach involving marking the uppermost green sheet is disadvantageous in that the mark or internal electrodes shift in position at the step of pressing the laminated board, making it impossible to cut the laminated product at the predetermined position and hence causing a yield drop. With the miniaturization of electronic apparatus, the smaller the thickness of the ceramic layer 1 between the internal electrodes 2 and 2X is, or the more the number of laminations is, the more difficult is to confirm the cutting position under microscope or otherwise by mark or difference in level. This confirming step requires much time.

SUMMARY OF THE INVENTION

An object of the present invention is to provide a method for judging the propriety of cutting position on a laminated board by which the propriety of cutting position on a laminated board can be easily confirmed for every board unit or laminated product and laminated ceramic electronic parts thus obtained.

According to a first aspect of the present invention, a method for judging the propriety of cutting position on a laminated board, comprises the steps of: laminating ten or more green sheets having a plurality of internal electrodes formed thereon to form a laminated board; cutting the laminated board along longitudinal and crosswise cutting lines to cause the internal electrodes to be exposed at the edge face of the laminated product thus produced; providing a partial blank of internal electrode on the area of the green sheets on which an internal electrode is formed and at which it is to be cut adjacent to a main part of the internal electrode constituting the capacitance of a capacitor; and judging the cutting position good when a non-exposed portion corresponding to the partial blank of internal electrode exists on the edge face of a laminated product obtained by cutting the laminated board or defective when the internal electrode corresponding to the main part of internal electrode is exposed at the edge face of the laminated product.

According to second aspect of the present invention, a laminated ceramic electronic part comprises ten or more internal electrode layers which are laminated via ceramic layers interposed therebetween to form a laminated body, the internal electrodes being exposed at the edge face of the laminated product; wherein two leading portions are formed at the leading side of internal electrode, and the end of the two leading portions are exposed at the edge face of the laminated product so that a non-exposed portion is formed between the two exposed portions.

According to third aspect of the present invention, a laminated ceramic electronic part comprises ten or more internal electrode layers which are laminated via ceramic layers interposed therebetween to form a laminated body, the internal electrodes being exposed at the edge face of the laminated product; wherein one or two leading portions having a width smaller than that of a main part of the internal electrode constituting the capacitance of a capacitor are formed at the leading side of internal electrode; the end of the leading portions are exposed at the edge face of the laminated product; and the longitudinal depth of the leading portions from the edge face of the laminated product is determined smaller than the distance of the edge face of the laminated product and the end of another internal electrode vertically opposed the internal electrode.

According to fourth aspect of the present invention, a laminated ceramic electronic part according to the first to the third aspect of the present invention, the width of the non-exposed portion of internal electrode between the leading portions is not less than 20 µm and not more than half the width of the exposed edge face of the internal electrodes of the laminated product.

According to fifth aspect of the present invention, a laminated ceramic electronic part according to the first to fourth aspect of the present invention, the depth of the leading portions of internal electrode is not less than 10 µm and smaller than the distance between the edge face of the laminated product and the end of another internal electrode vertically opposed to the internal electrode.

In the present invention, when the edge face of the laminated board thus cut is observed, it is found that there is some difference in color or brilliance between ceramic and internal electrode. Therefore, if the laminated board is cut at the desired position, the exposure of only a narrow portion which acts as a leading portion can be readily judged visually. Of course, a microscope or other optical means may be used for the sake of accuracy.

On the other hand, if the laminated board is cut at a position other than the desired position, the internal electrodes are exposed at a position where they should not. Therefore, this condition can be readily judged visually as defective cutting position.

Thus, the laminated product is examined by confirming the difference in the exposed width or the presence or absence of non-exposed portion, making it possible to readily confirm if the laminated product has been cut at the desired position and hence reduce the time required for confirmation. Further, it can be previously confirmed if the laminated product has been cut at the desired position, making it easy to correct the cutting position on the subsequent laminated board after cutting.

In the present invention, if two leading portions are formed on the same edge face of an internal electrode, the width of the leading portion, i.e., the width of the non-exposed portion of the internal electrode can be not less than 20 µm and half the width of the edge face of a chip to secure electrical connection between the terminal electrode and the leading portion.

Further, the depth of the leading portion on an internal electrode can be not less than 10 µm and less than the distance between the edge face of the laminated product and the end of another internal electrode vertically opposed to the internal electrode so that the opposed area of the two adjacent internal electrodes can be the same as conventional. In this arrangement, the capacitance of such a capacitor is not reduced as compared with the conventional product.

BRIEF DESCRIPTION OF THE DRAWINGS

In the accompanying drawings:

FIG. 2 is a developed view illustrating the laminated structure of the present example;

FIG. 6A is a perspective view illustrating a conventional laminated board;

FIG. 6B is an end view illustrating the conventional laminated board which has been cut.

DETAILED DESCRIPTION OF THE INVENTION

A detailed description of the present invention will be described as follows referring to the accompanying drawings.

Figure 1A:
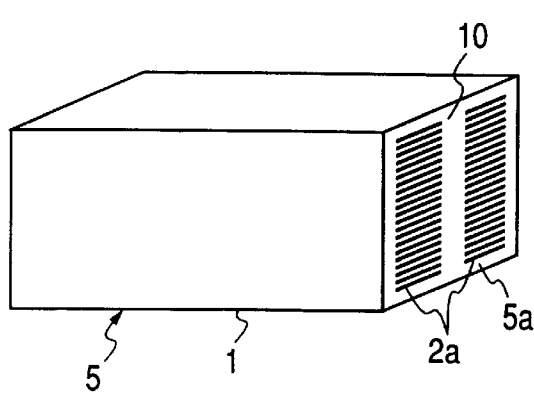
FIGS. 1A is a perspective view illustrating an embodiment of the laminated ceramic electronic part according to the present invention in the form of laminated product which has not yet have terminal electrodes formed on the end thereof wherein the electronic part is a ceramic capacitor.
Figure 1B:
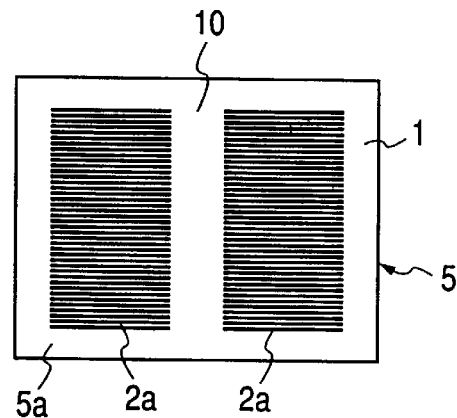
FIGS. 1B is an end view both illustrating an embodiment of the laminated ceramic electronic part according to the present invention in the form of laminated product which has not yet have terminal electrodes formed on the end thereof wherein the electronic part is a ceramic capacitor.
Figure 1C:
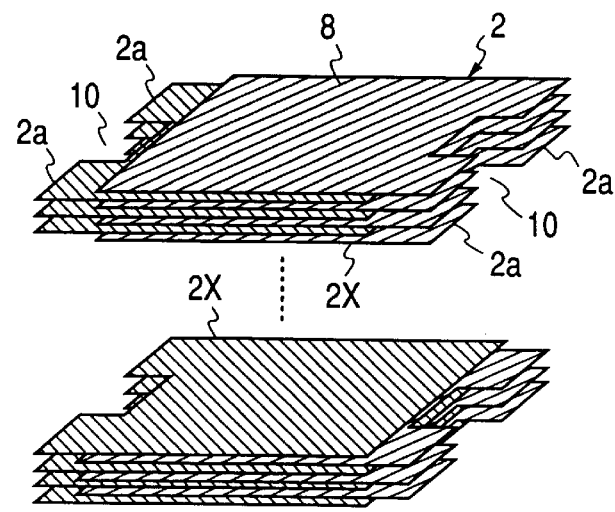
FIG. 1C is a perspective view illustrating the laminated structure of an internal electrode of the present example.
Figure 1D:
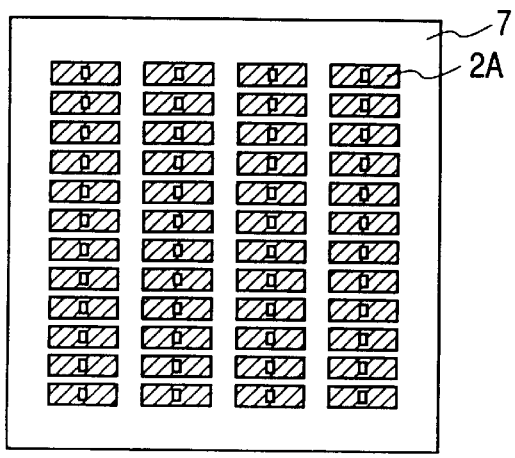
FIG. 1D is a plan view illustrating an embodiment of a green sheet having an internal electrode formed therein.
Figure 1E:
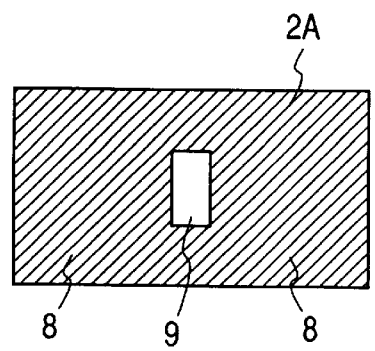
FIG. 1E is a diagram illustrating the pattern of an internal electrode.

FIGS. 1A and 1B are a perspective view and an end view both illustrating an embodiment of the laminated ceramic electronic part according to the present invention in the form of laminated product which does not yet have terminal electrodes formed on the end thereof wherein the electronic part is a ceramic capacitor. FIG. 1C is a perspective view illustrating the laminated structure of an internal electrode of the present example. FIG. 1D is a plan view illustrating an embodiment of a green sheet having an internal electrode formed therein. FIG. 1E is a diagram illustrating the pattern of an internal electrode.

In the present invention, in order to obtain a green sheet 7 as shown in FIG. 1D, a ceramic dielectric powder for nickel internal electrode having characteristics according to JIS B was kneaded with necessary components such as organic solvent, plasticizer and binder in a ball mill to prepare a ceramic paste. The ceramic paste thus prepared was then subjected to doctor blade coating to prepare a sheet 7 having a thickness of 7 µm. Using a plate-making screen having a plurality of internal electrode patterns 2A arranged thereon as shown in FIG. 1E, nickel was then printed on the sheet 7 as an internal electrode.

The internal electrode pattern 2A has a partial blank 9 (blank pattern) formed between the internal electrode main parts 8, 8. As shown in a developed view of FIG. 2, a sectional view of FIG. 3A and a plan view of FIG. 3B, internal electrode layers are laminated so that the partial blank 9 in an internal electrode at a layer is not opposed to that in another internal electrode vertically adjacent thereto. In some detail, 200 layers were laminated in such an arrangement that products each having a size of 3.2 mm×1.6 mm are formed.

Figure 3A:
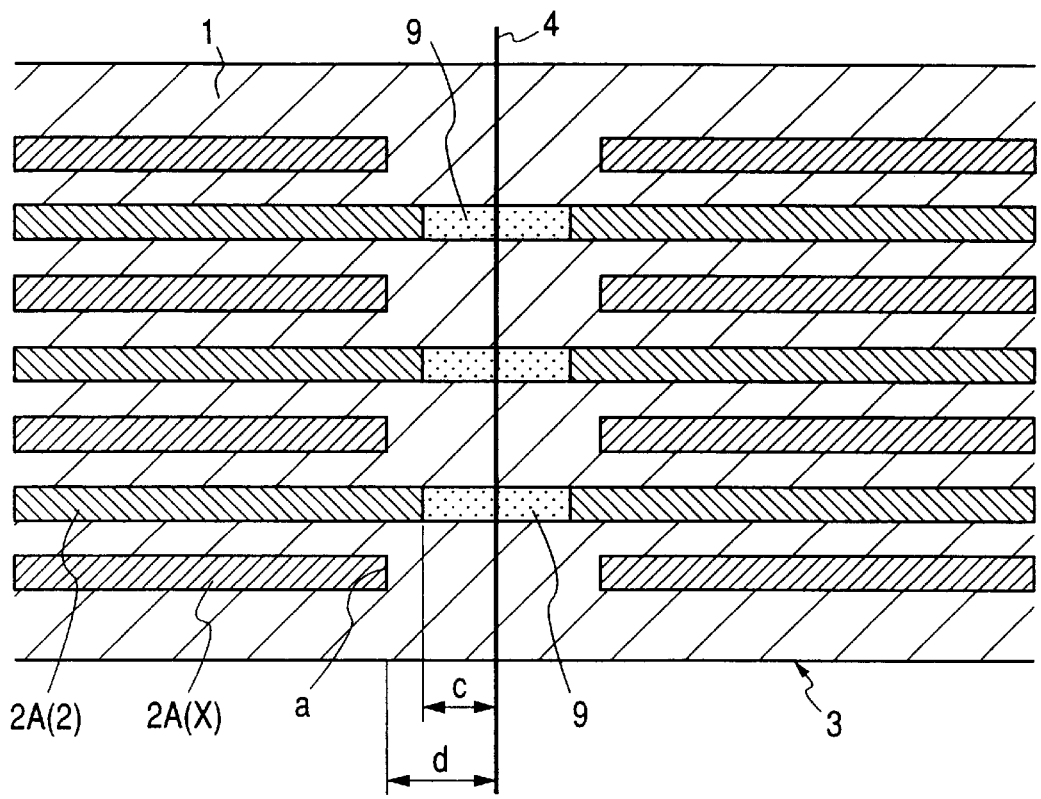
FIG. 3A is a sectional view illustrating the position of the internal electrode in the laminated structure of the present example which has not yet been cut.
Figure 3B:
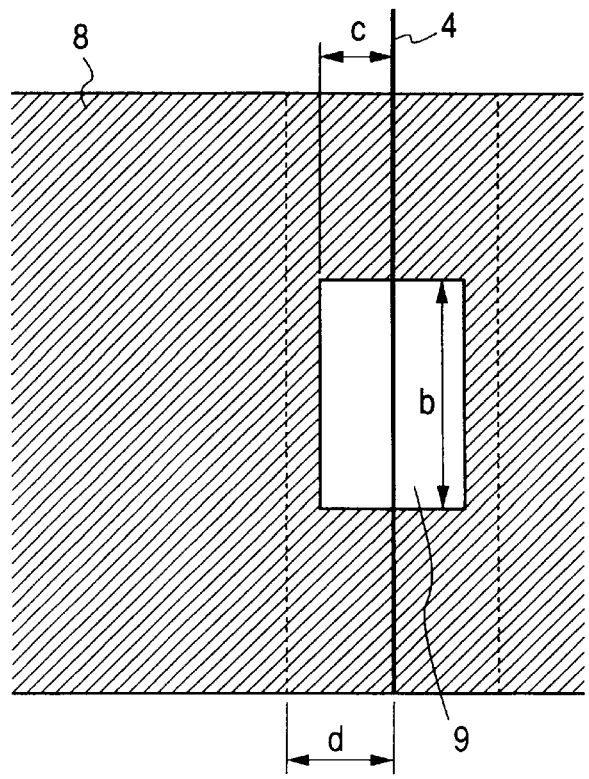
FIG. 3B is a partially enlarged plan view of an internal electrode pattern of the present example.

As shown in FIGS. 3A and 3B, the width b of the partial blank 9 along the cutting line 4 and the depth c perpendicular to and from the cutting line 4 were predetermined to 200 µm and 100 µm, respectively. The longitudinal distance d between the edge of the partial blank 9 in an internal electrode and the end of the pattern 2A in another internal electrode vertically adjacent thereto was predetermined to 200 µm. The width of the leading portions 2a thus formed are each smaller than that of the main part 8 constituting the capacitance of the internal electrodes 2, 2X.

Figure 4A:
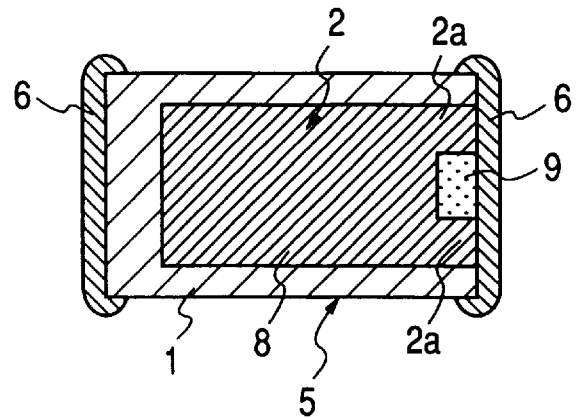
FIG. 4A is a plan view illustrating the laminated ceramic electronic part of the present example.

The laminated board thus formed was then cut by a wet process rotary cutter. Thereafter, as shown in FIG. 4A, a terminal electrode 6 was formed on both ends thereof by baking or plating.

The capacitor thus obtained has a laminated product 5 having leading portions 2a of the internal electrodes 2, 2X exposed in two lines at both ends thereof as shown in FIGS. 1A and 1B.

Figure 4B:
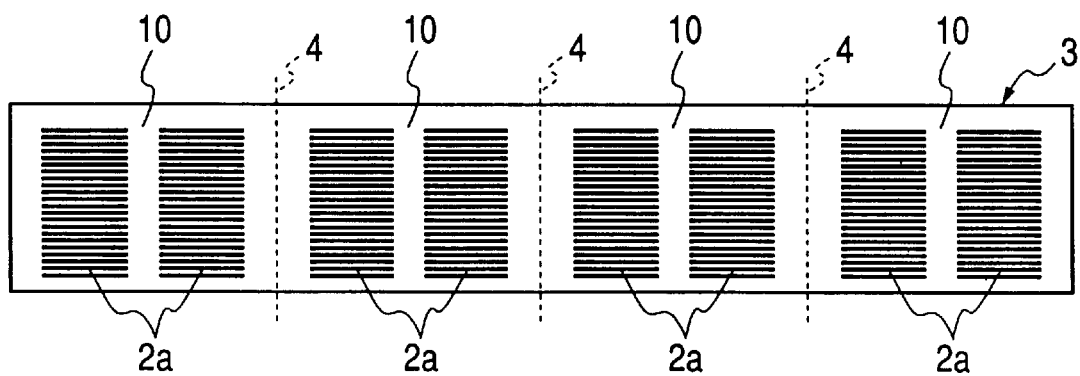
FIGS. 4B and 4C are end views illustrating the case where the cutting position on the laminated board is appropriate and inappropriate, respectively.
Figure 4C:
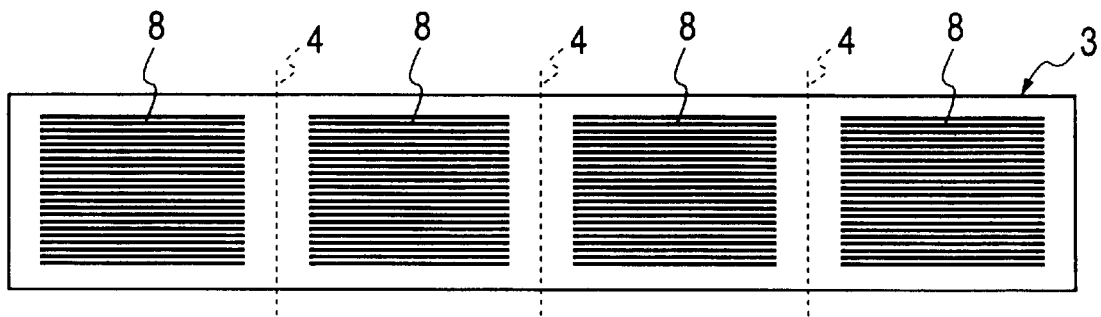

The examination for the propriety of cutting position is effected every cutting line, i.e., every portion of a plurality of chips, while leading portions 11 are being exposed at the edge face of the laminated product which has been crosswise cut as shown in FIGS. 4B and 4C. If two lines of leading portions 2a of internal electrode 2 are exposed at the edge face of each of the various laminated products 5 and a non-exposed portion 10 exists between the two lines of leading portions 2a as shown in FIG. 4B, the cutting position is judged appropriate. If the non-exposed portion 10 does not exist as shown in FIG. 4C, the cutting position is judged defective. The judgment of the propriety of cutting position may be effected every laminated product 5.

In this manner, a conventional laminated ceramic capacitor and a laminated ceramic capacitor according to the present invention were examined for the number of malcut boards in 50 boards, the number of boards required to determine cutting position, the time required to confirm malcut every board, the capacitance, the scattering of capacitance (3σ/average) and the percent occurrence of shortcircuiting. The results are set forth in Tables 1-(1) and 1-(2).

TABLE 1-(1)

|  | Number of boards required to determine cutting position | Number of malcuts | Time required to detect malcuts (min/board) |
| --- | --- | --- | --- |
| Conventional product | 4 | 2,240 | 5.0 |
| Present Invention | 1 | 0 | 0.5 |

TABLE 1-(2)

|  | Average capacitance (µF) (n = 30) | Scattering of capacitance (%) (n = 30) | Occurrence of short-circuiting (%) |
| --- | --- | --- | --- |
| Conventional product | 4.73 | 4.5 | 9.3 |
| Present Invention | 4.77 | 4.3 | 4.5 |

As can be seen in Table 1, the laminated ceramic capacitor having a structure according to the present invention is very excellent in the number of malcut, time required to examine malcut, number of boards required to determine cutting conditions and percent occurrence of shortcircuiting as compared with the conventional product. Further, the laminated ceramic capacitor according to the present invention showed no capacitance change and capacitor scattering increase due to the crosswise blank of printed internal electrode 2.

In the present invention, since the board has a part on which the internal electrode 2 is not printed, proper cutting position can be easily detected. Thus, the number of boards required to determine cutting position is very small as compared with that for the conventional product. Since proper cutting position can be easily detected, some products according to the present invention showed no malcuts. Tables 1-(1) and 1-(2) illustrates an example of cutting by a wet process rotary cutter. However, a dry force-cutting process gave almost the same occurrence of malcut as above.

The crosswise dimension of the partial blank 9 on which the internal electrode 2 is not printed was studied for every laminated product 1. The results are set forth in Table 2 (1). As can be seen in Table 2-(1), if the width of the unprinted portion falls below 20 µm, it is very difficult to visually confirm the unprinted portion. Further, since prints obtained by plate-making screen has a poor precision, the unprinted portion can be hardly judged.

On the other hand, it can be seen that if the width of the unprinted portion at a layer exceeds 800 µm, which is half the width of the ceramic product thus completed (since the width of the ceramic product of the present example is 1.6 mm, half that value is 0.8 mm), the size of the leading electrode of the internal electrode 2 is reduced, causing defective connection to the terminal electrode 6 that gives an increased variation of capacitance and hence making it possible to put this product into practical use.

Table 2-(2) illustrates the results of study of the depth c of the crosswise unprinted portion at the exposed internal electrode 2 per laminated ceramic electronic part. The crosswise dimension b of the unprinted portion was 200 μm. When the depth c of the unprinted portion fell below 10 μm, the color of the internal electrode present inside the laminated product fell on that of the unprinted portion, making it difficult to distinguish the unprinted portion and the exposed internal electrode by color. Thus, the effect of the present invention could not be confirmed. On the contrary, when the depth c of the unprinted portion exceeded the distance d to the opposing electrode 2X (200 μm), the resulting capacitance was reduced, rendering the product disadvantageous from the standpoint of design. However, the effect of determining cutting position could be sufficiently confirmed.

TABLE 2-(1)

| Longitudinal width (μm) of unprinted portion (blank pattern) | Visual confirmation of position | Average capacitance (μm) (n = 30) | Scattering of capacitance (%) (n = 30) |
| --- | --- | --- | --- |
| 10 | Impossible | 4.73 | 4.5 |
| 20 | Possible | 4.75 | 4.6 |
| 200 | Possible | 4.77 | 4.3 |
| 400 | Possible | 4.71 | 4.8 |
| 800 (half the width of board) | Possible | 4.69 | 5.1 |
| 1,000 | Possible | 4.56 | 15.6 |

TABLE 2-(2)

| Depth (μm) of unprinted portion (blank pattern) | Visual confirmation of position | Average capacitance (μm) (n = 30) | Scattering of capacitance (%) (n = 30) |
| --- | --- | --- | --- |
| 5 | Impossible | 4.75 | 4.8 |
| 10 | Possible | 4.73 | 4.1 |
| 100 | Possible | 4.77 | 4.3 |
| 200 (distance to opposing electrode) | Possible | 4.72 | 4.3 |
| 250 | Possible | 4.61 | 5.0 |

If the distance d between the cutting line 4 (edge face 5a of an internal electrode 2) and the end a of the internal electrode 2X adjacent thereto is reduced as shown in FIGS. 3A and 3B, the edge face 5a of the laminated product is closer to the end a of the internal electrode 2X adjacent to the internal electrode 2, occasionally causing the foregoing change with time. Therefore, the foregoing depth c is preferably predetermined smaller than the foregoing distance d (d>c). Further, when the number of the internal electrodes 2, 2X is 10 or more, the cutting position could be easily confirmed by the difference in color or brilliance between the internal electrode and the ceramic. On the contrary, when the number of the internal electrodes 2, 2X fell below 10, the discrimination by color or brilliance was very difficult.

The term "scattering of capacitance" as used herein is meant to indicate the percentage obtained by multiplying the standard deviation σ of capacitance values by 3, and then diving the product by the average capacitance (Scattering of capacitance=3σ/average capacitance (%)). The greater this percentage is, the greater is the scattering of capacitance.

In accordance with the present invention, the depth c of the unprinted portion can be saved. Therefore, the distance to the opposing electrode, if it is needed to be assured, can be assured by changing the dimension of the portion on the plate-making screen corresponding to the unprinted portion.

Figure 5A:
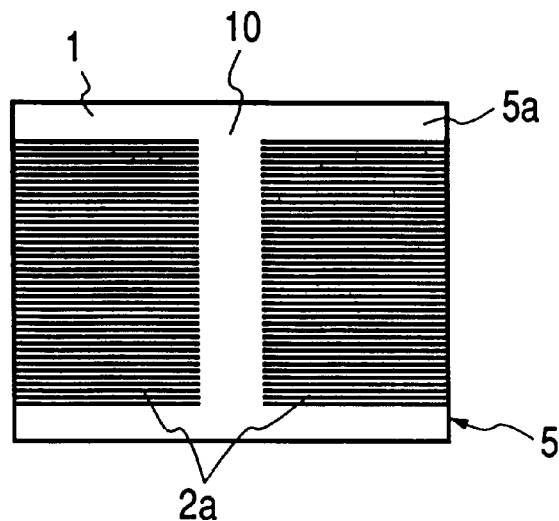
FIG. 5A is an end view illustrating how the laminated ceramic electronic part of the present invention appears before the formation of terminal electrode.
Figure 5B:
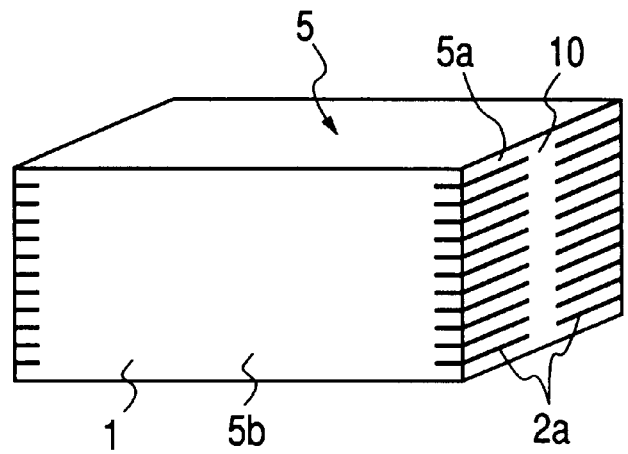
FIG. 5B is a perspective view of the laminated ceramic electronic part of FIG. 5A.

FIG. 5A is an end view illustrating another embodiment of the laminated ceramic electronic part according to the present invention. FIG. 5B is a perspective view of the laminated ceramic electronic part of FIG. 5A. In this embodiment, the leading portion 2a is exposed not only at the edge face 5a of the laminated product 5 but also at the side 5b in the vicinity of the corner. In accordance with this embodiment, if the terminal electrode 6 is formed covering the side 5b as well, good electrical connection can be provided.

Figure 5C:
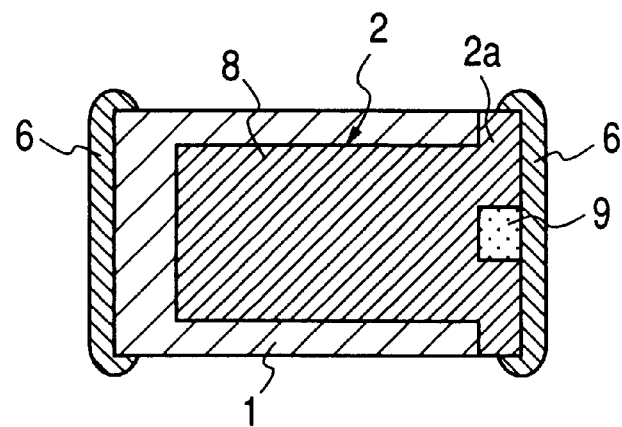
FIG. 5C is a plan view illustrating another embodiment of the laminated ceramic electronic part according to the present invention.
Figure 7:
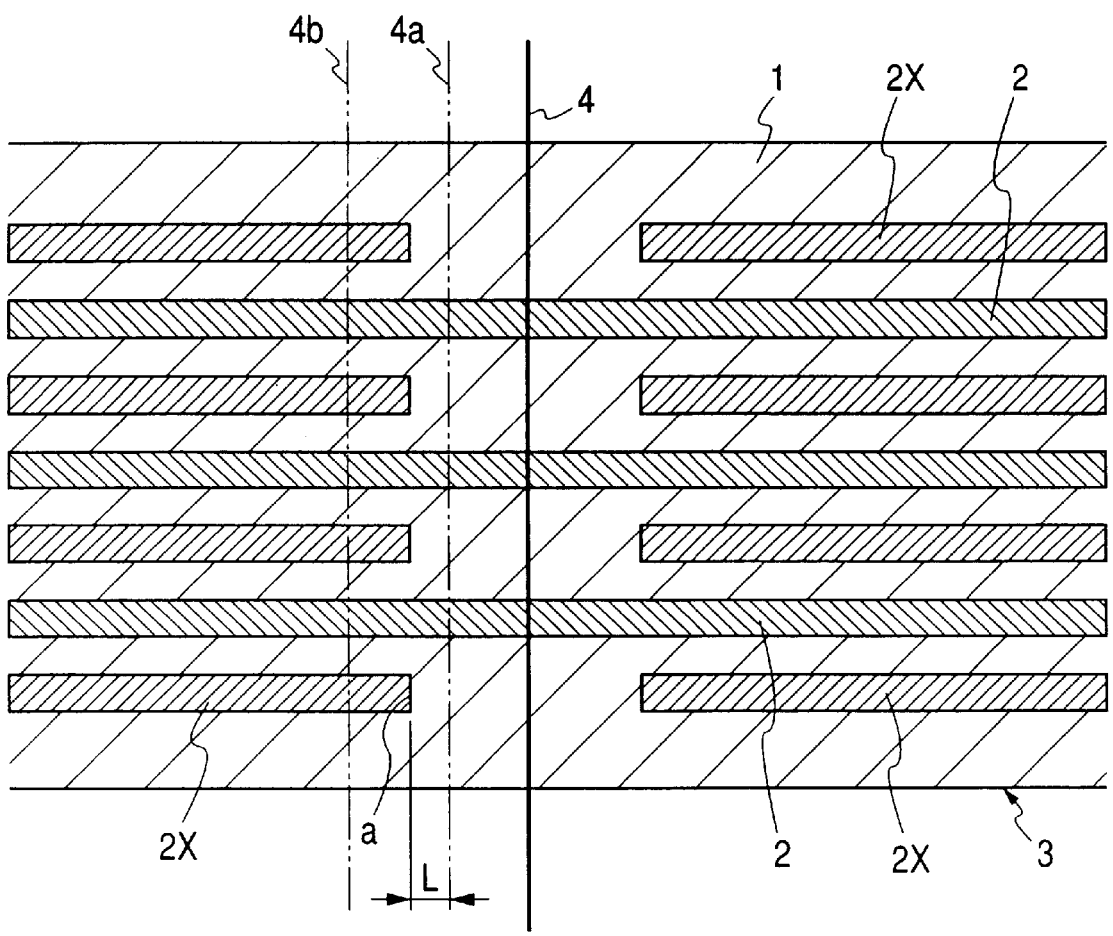
FIG. 7 is a sectional view illustrating the conventional laminated board.

FIG. 5C illustrates an example of a structure in which the partial blank 9 is provided at the corner of the laminated product rather than at the center of the end of the internal electrode 2 to give one leading portion 2a. In accordance with this example, too, the propriety of cutting position can be judged. However, the propriety of cutting position can be more easily judged by confirming the presence of non-exposed portion between the two lines of exposed portions as in the foregoing examples than by this embodiment.

The present invention can be applied not only to a laminated product having capacitors alone incorporated therein but also to a laminated product having capacitors complexed with other elements incorporated therein.

In accordance with the present invention, a partial blank of internal electrode is previously provided on the area of a green sheet on which an internal electrode is formed and at which it is to be cut adjacent to a main part of the internal electrode constituting the capacitance of a capacitor so that the propriety of cutting position can be judged by examining if a non-exposed portion corresponding to the partial blank of internal electrode exists on the edge face of the laminated product obtained by cutting the laminated board. Further, the distance between the edge face of the laminated product obtained by cutting and another internal electrode opposed to the internal electrode can be assured, making it possible to enhance the yield. Moreover, the product according to the present invention has a smaller area free of internal electrode than conventional products. Thus, the amount of material to be used per internal electrode can be reduced as compared with conventional products, making a contribution to cost reduction, particularly for ordinary type laminated ceramic chip capacitor such as palladium-based ceramic chip capacitor.

In accordance with the present invention, two leading portions are formed at the leading side of internal electrode and the end of said two leading portions are exposed at the edge face of said laminated product so that a non-exposed portion is formed between said two exposed portions. In this arrangement, the propriety of cutting position can be more easily judged than the structure in which a non-exposed portion is provided at the both sides of the end of the main part of internal electrode.

In accordance with the present invention, one or two leading portions having a width smaller than that of a main part of said internal electrode constituting the capacitance of a capacitor are formed at the leading side of internal electrode, the end of said leading portions are exposed at the edge face of said laminated product, and the longitudinal depth of said leading portions from the edge face of said laminated product is predetermined smaller than the distance of the edge face of said laminated product and the end of another internal electrode vertically opposed the internal electrode. The propriety of cutting position can be easily judged. Further, the distance between the edge face of the laminated product obtained by cutting and another internal electrode opposed to the internal electrode can be assured, making it possible to enhance the yield.

In accordance with the present invention, two leading portions are formed on said internal electrodes and the width of said non-exposed portion of internal electrode between said leading portions is not less than 20 μm and not more than half the width of the exposed edge face of the internal electrodes of said laminated product. In this arrangement, electrical connection between the internal electrode and the terminal electrode in the completed product can be assured.

In accordance with the present invention, the depth of said leading portions of internal electrode is predetermined to be not less than 10 μm and smaller than the distance between the edge face of said laminated product and the end of another internal electrode vertically opposed to said internal electrode. In this arrangement, the opposed area of the two adjacent internal electrodes can be assured. Thus, the capacitance of such a capacitor is not reduced as compared with the conventional product.

What is claimed is:

1. A laminated ceramic part comprising:
    a laminated body including a plurality of internal electrodes on laminated ceramic layers,
    wherein said plurality of internal electrodes are exposed at an edge face of said laminated body,
    wherein each of the plurality of the internal electrodes include two leading portions at a leading side of the internal electrodes, and
    wherein said each of the plurality of electrodes includes a non-exposed portion between the two leading portions.

2. A laminated ceramic electronic part according to claim 1, wherein a width of said non-exposed portion is not less than 20 μm and is not more than half a width of the laminated body.

3. A laminated ceramic electronic part according to claim 2, wherein a depth of said two leading portions from the edge face of said laminated body to an end of the non-exposed portion is predetermined to be not less than 10 μm and is smaller than a depth from the edge face of said laminated body to an end of another internal electrode adjacent to said internal electrodes.

4. A laminated ceramic electronic part according to claim 1, wherein a depth of said two leading portions from the edge face of said laminated body to an end of the non-exposed portion is not less than 10 μm and is smaller than a depth from the edge face of said laminated body to an end of another internal electrode adjacent to said internal electrodes.

5. A laminated ceramic part comprising:
    a laminated body including a plurality of internal electrodes on laminated ceramic layers,
    wherein said plurality of internal electrodes are exposed at the an edge face of said laminated body,
    wherein each of the plurality of electrodes includes two leading portions at a leading side of the internal electrodes, and at least one of the two leading portions has a width smaller than a width of a main part of said internal electrodes forming a capacitance of a capacitor,
    wherein ends of said two leading portions are exposed at an edge face of said laminated body, and
    wherein a depth of said two leading portions from the edge face of said laminated body to an end of a non-exposed portion between the two leading portions is smaller a depth from the edge face of said laminated body to an end of another internal electrode adjacent to the internal electrodes.

6. A laminated ceramic electronic part according to claim 5, wherein a width of said non-exposed portion is not less than 20 μm and is not more than half a width of the laminated body.

7. A laminated ceramic electronic part according to claim 6, wherein the depth of said two leading portions from the edge face of said laminated body to the end of the non-exposed portion is predetermined to be not less than 10 μm and is smaller than the depth from the edge face of said laminated body to the end of another internal electrode adjacent to said internal electrodes.

8. A laminated ceramic electronic part according to claim 5, wherein the depth of said two leading portions from the edge face of said laminated body to the end of the non-exposed portion is predetermined to be not less than 10 μm and is smaller than the depth from the edge face of said laminated body to the end of another internal electrode adjacent to said internal electrodes.

* * * * *